United States Patent
Soyano

(10) Patent No.: US 8,546,933 B2
(45) Date of Patent: Oct. 1, 2013

(54) SEMICONDUCTOR APPARATUS INCLUDING RESIN CASE

(75) Inventor: Shin Soyano, Shiojiri (JP)

(73) Assignee: Fuji Electric Co., Ltd. (JP)

( * ) Notice: Subject to any disclaimer, the term of this patent is extended or adjusted under 35 U.S.C. 154(b) by 108 days.

(21) Appl. No.: 13/175,151

(22) Filed: Jul. 1, 2011

(65) Prior Publication Data

US 2012/0001309 A1 Jan. 5, 2012

(30) Foreign Application Priority Data

Jul. 1, 2010 (JP) .................................. 2010-150931

(51) Int. Cl.
*H01L 23/04* (2006.01)
*H01L 23/06* (2006.01)

(52) U.S. Cl.
USPC .................. 257/704; 257/729; 257/E23.002; 257/E23.193

(58) Field of Classification Search
None
See application file for complete search history.

(56) References Cited

U.S. PATENT DOCUMENTS

| | | | | |
|---|---|---|---|---|
| 5,358,773 A | * | 10/1994 | Fujii et al. | 428/167 |
| 5,719,746 A | * | 2/1998 | Ohbuchi et al. | 361/737 |
| 7,320,250 B2 | * | 1/2008 | Ueno | 73/754 |
| 2002/0114577 A1 | * | 8/2002 | Kondo et al. | 385/51 |
| 2005/0051885 A1 | * | 3/2005 | Weng et al. | 257/687 |
| 2005/0285258 A1 | * | 12/2005 | Chen et al. | 257/706 |
| 2006/0024477 A1 | * | 2/2006 | Ito | 428/137 |
| 2006/0091799 A1 | * | 5/2006 | Nakamura | 313/512 |
| 2006/0179953 A1 | * | 8/2006 | Ueno | 73/754 |
| 2007/0165070 A1 | * | 7/2007 | Honma et al. | 347/47 |
| 2010/0001207 A1 | * | 1/2010 | Shibahara | 250/458.1 |
| 2010/0003580 A1 | * | 1/2010 | Shirahama | 429/36 |
| 2011/0074007 A1 | * | 3/2011 | Lopez et al. | 257/692 |
| 2011/0115083 A1 | * | 5/2011 | Zang et al. | 257/738 |

FOREIGN PATENT DOCUMENTS

| | | |
|---|---|---|
| JP | 59-177949 A | 11/1984 |
| JP | 07-030006 A | 1/1995 |
| JP | 2000-077602 A | 3/2000 |
| JP | 3196540 B2 | 6/2001 |
| JP | 2003-051560 A | 2/2003 |
| JP | 2004-103846 A | 4/2004 |
| JP | 2004103846 A | * 4/2004 |

OTHER PUBLICATIONS

Machine Translation of JP 2004-103846.*
"Notification of Reasons for Refusal" for corresponding JP 2010-150931, mail date Mar. 19, 2013. Partial English translation provided.

* cited by examiner

*Primary Examiner* — Thomas L Dickey
*Assistant Examiner* — Joseph Schoenholtz
(74) *Attorney, Agent, or Firm* — Rossi, Kimms & McDowell LLP

(57) ABSTRACT

A semiconductor apparatus according to aspects of the invention can include a metal base; resin case having a bonding plane facing metal base; a coating groove formed in bonding plane and holding adhesive for bonding resin case to metal base at a predetermined position, with the top plane of the wall that forms coating groove being spaced apart from the plane which contains bonding plane such that an escape space is formed between the metal base and the resin case; the escape space receiving the excess amount of adhesive which has flowed out from the coating groove; and a receiver groove communicating to the escape space and receiving securely the excess amount of adhesive which the escape space has failed to receive. If an excess amount of adhesive too much for the receiver groove to receive is coated, the excess amount of adhesive can be received in a stopper groove.

5 Claims, 3 Drawing Sheets

SEMICONDUCTOR APPARATUS INCLUDING RESIN CASE

BACKGROUND OF THE INVENTION

1. Field of the Invention

Embodiments of the present invention relate to semiconductor apparatuses. Specifically, the embodiments of present invention relate to semiconductor apparatuses having a package structure including a base and a case bonded to the base with an adhesive.

2. Related Art

FIG. 3(A) is the top plan view of a conventional semiconductor apparatus showing an example of a package structure. FIG. 3(B) is the cross sectional view along a-a of FIG. 3(A). FIG. 3(C) is the expanded illustration of the part b in FIG. 3(B).

In the semiconductor apparatus shown in FIGS. 3(A) through 3(C), insulator baseboard 11 is mounted on metal base 10 for heat dissipation. Semiconductor chips 12, 13, 14, and 15 are mounted on insulator baseboard 11. Insulator baseboard 11 is bonded to metal base 10 with a solder via a metal foil formed on one surface of insulator baseboard 11. To another metal foil formed on the other surface of insulator baseboard 11, semiconductor chips 12, 13, 14, and 15 are bonded with a solder. Semiconductor chips 12, 13, 14, and 15 may include an insulated-gate bipolar transistor (IGBT) and a free-wheeling diode.

Frame-shaped resin case 16 is put on insulator base board 11 such that resin case 16 surrounds insulator baseboard 11. Resin case 16 is bonded to baseboard 11 with adhesive 17. External terminals are inserted to resin case 16 such that the resin case and the external terminals are formed into a unit. As for the external terminals, external main circuit terminals 18, 19, 20 and 21 and external control terminals 22, 23, 24, and 25 are arranged for semiconductor chips 12 and 14. Semiconductor chips 12 and 14 and external main circuit terminals 18, 19, 20 and 21 are connected electrically to each other by bonding wires 26. Semiconductor chips 12 and 14 and external control terminals 22, 23, 24, and 25 are connected electrically to each other by bonding wires 27.

Resin case 16 is filled with a silicone gel to seal the circuits connected by the wire bondings therein. Resin case 16 is closed with a cover (not shown). Although not illustrated, a bolt for fastening the semiconductor apparatus to a radiator fin is inserted to hole 28 bored through metal base 10 outside resin case 16.

For bonding resin case 16 to metal base 10, a protrusion is formed on the edge of the resin case 16 surface facing metal base 10, the gap caused by the protrusion between resin case 16 and metal base 10 is filled with adhesive 17, and adhesive 17 is cured thermally. This bonding method facilitates obtaining a sufficient bonding strength, since the bonding area is wide. However, it is necessary to coat a large amount of adhesive 17.

To obviate this problem, Japanese Unexamined Patent Application Publication No. 2003-51560 (also referred to herein as "Patent Document 1") and Japanese Unexamined Patent Application Publication No. 2004-103846 (also referred to herein as "Patent Document 2") propose a technique as described below. The proposed technique forms a groove in the resin case surface facing the metal base, and fills the groove with an adhesive to suppress the coating amount of the adhesive. The groove extends continuously along all the peripheral sides of the resin case surface. Here, it is necessary to raise the bonding strengths in the vicinity of the portion of the resin case, to which external main circuit terminals are inserted, and in the vicinity of the portion of the resin case, to which external control terminals are inserted. In the portions of the resin case described above (hereinafter referred to as the "terminal-insertion portions"), the bonding wires are bonded by ultrasonic welding. Since the ultrasonic vibration forces are exerted to the terminal-insertion portions, it is required for the terminal-insertion portions to exhibit an especially high bonding strength. Therefore, a plurality of grooves is formed in the terminal-insertion portions to improve the bonding strength thereof.

The adhesive is coated to the groove with a dispenser capable of controlling the coating amount of the adhesive. If the coating amount is insufficient, a sufficient bonding strength is not secured. If peelings or cracks are caused in the adhesive, the silicone gel loaded in the resin case will leak outside. Therefore, the dispenser coats to the groove more than a necessary amount of the adhesive.

If the coating amount of the adhesive to the groove is too large, an excess amount of the adhesive will flow out from the groove to the outside or the inside of the resin case when the resin case is laid on the metal base. If the adhesive flows to the outside of the resin case, the external appearance of the resin case will be impaired. Moreover, if the adhesive which has flowed out sticks to the contact plane of the metal base and the radiator fin and hardens there, the surface height of the metal base will become nonuniform and the cooling efficiency will be impaired. If the adhesive which has flowed to the inside of the resin case contaminates the bonding planes of the bonding wires, the strength of the bonding portion formed by ultrasonic welding will be lowered. Japanese Unexamined Patent Application Publication No. Hei. 7 (1995)-30006 (also referred to herein as "Patent Document 3") describes a method that provides the resin case with an adhesive escape groove to prevent an excess amount of the adhesive from flowing out.

However, the gap between the resin case plane except the groove and the metal base plane is narrow in the state, in which the resin case is pressed to the metal base and the adhesive is heated and hardened. If the coating amount of the adhesive is excess even slightly, the adhesive which has flowed out expands through the narrow gap widely and flows to the outside and inside of the resin case. Even if an adhesive escape groove is formed in the area, in which many grooves are formed, it will be difficult for the adhesive escape groove to prevent the adhesive from flowing out. It is also difficult to control the coating amount of the adhesive exactly so that the amount of the adhesive flowing out may be small as much as possible.

In view of the foregoing, it would be desirable to obviate the problems described above. It would be also desirable to provide a semiconductor apparatus which has a bonding structure that facilitates securing a sufficient bonding strength between a resin case and a metal base and reducing substantially the amount of the adhesive that flows out.

SUMMARY OF THE INVENTION

According to the invention, there is provided a semiconductor apparatus including; a metal base; a frame-shaped resin case bonded to the metal base for forming a space, in which a semiconductor chip is housed; an adhesive coating groove holding an adhesive at a predetermined position for bonding the resin case to the metal base, the adhesive coating groove being formed in the bonding plane of the resin case facing the metal base such that the adhesive coating groove extends continuously along all the peripheral sides of the bonding plane; and an adhesive escape space formed between the top plane of the side wall of the adhesive coating groove and the metal base, the top plane being spaced apart from a plane containing the bonding plane for introducing and receiving therein an excess amount of the adhesive coated to the adhesive coating groove.

The excess amount of the adhesive that has flowed out from the adhesive coating groove is introduced into the adhesive escape space and hardened therein. The adhesive in the adhesive coating groove secures a sufficient bonding strength between the resin case and the metal base and the adhesive which has flowed out from the adhesive coating groove is received in the adhesive escape space and never expands further.

Because the semiconductor apparatus having the structure described above includes the adhesive escape space for receiving the excess amount of the adhesive which has flowed from the adhesive coating groove, the semiconductor apparatus according to the invention facilitates securing a sufficient bonding strength between the resin case and the metal base. Therefore, even if an excess amount of the adhesive is coated, the excess adhesive never expands so widely as to flow to the outside and inside of the resin case. Therefore, the semiconductor apparatus according to the invention prevents securely the adhesive from flowing out.

Fundamentally, the adhesive coating groove and the adhesive escape space are formed in the bonding plane of the resin case such that the adhesive coating groove and the adhesive escape space extend continuously along all the peripheral sides of the bonding plane. Alternatively, the adhesive coating groove and the adhesive escape space may be branched locally such that a plurality of the adhesive coating groove and a plurality of the adhesive escape space may be arranged locally to change the bonding strength, if necessary.

BRIEF DESCRIPTIONS OF THE DRAWINGS

MODES FOR CARRYING OUT THE INVENTION

Figure 3:
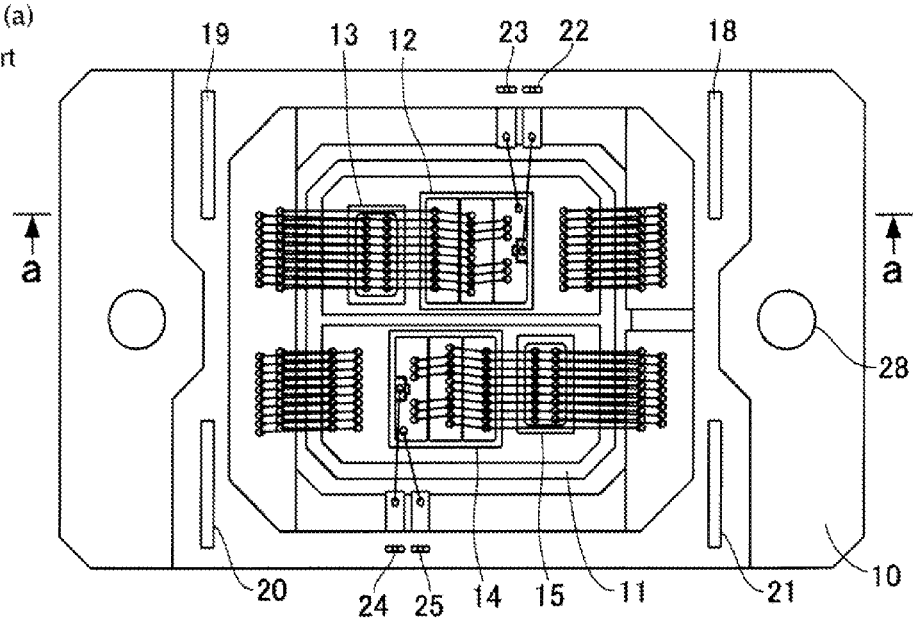
FIG. 3(A) is the top plan view of a conventional semiconductor apparatus showing an example of a package structure.
FIG. 3(B) is the cross sectional view along a-a of FIG. 3(A)
FIG. 3(C) is the expanded illustration of the part b in FIG. 3(B).
Figure 3:
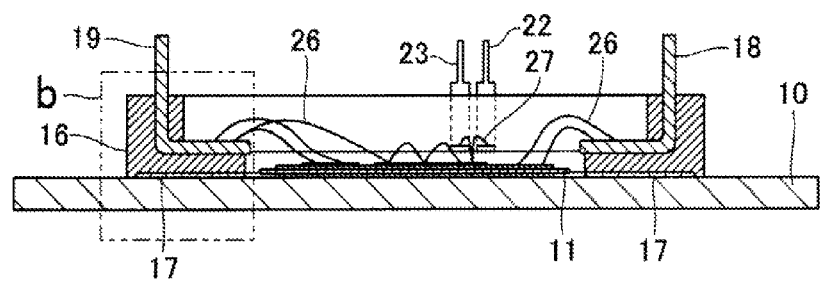
Figure 3:
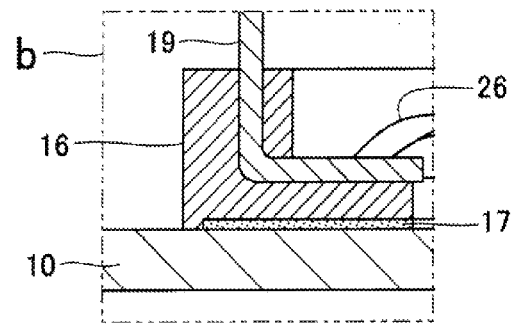

Now the invention will be described in detail hereinafter with reference to the accompanied drawings which illustrate the preferred embodiments of the invention. In the accompanied drawings which illustrate embodiments of the invention, the same reference numerals as used in FIGS. 3(A) through 3(C) are used to designate the same constituent elements and equivalents and their duplicated descriptions are omitted for the sake of clarity.

Figure 1:
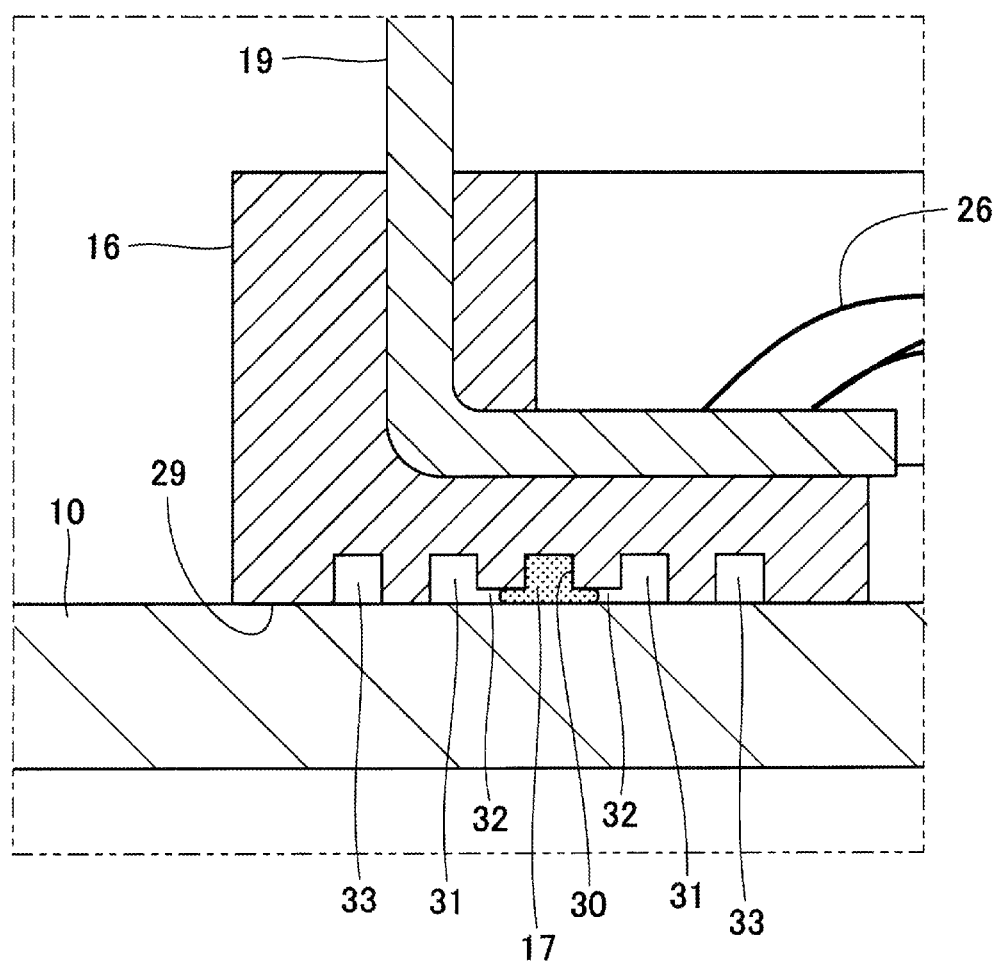
FIG. 1 is the expanded cross sectional view of a part of a semiconductor apparatus showing a groove combination according to a first embodiment of the invention.

FIG. 1 is the expanded cross sectional view of a part of a semiconductor apparatus showing a groove combination according to a first embodiment of the invention.

Referring now to FIG. 1, adhesive coating groove 30 that holds adhesive 17 for bonding frame-shaped resin case 16 to metal base 10 at a predetermined position (hereinafter referred to as "coating groove 30") is formed in bonding plane 29 of resin case 16 facing metal base 10. On both sides of coating groove 30, flowing-out-adhesive receiver grooves 31 for receiving the adhesive which has flowed out (hereinafter referred to as "receiver grooves 31") are formed in adjacent to coating groove 30. The top plane of the wall between coating groove 30 and receiver groove 31 which is facing metal base 10 is spaced apart from the plane containing bonding plane 29 such that adhesive escape space (hereinafter referred to as "escape space") 32 that makes the adhesive escape is formed.

According to the first embodiment of the invention, adhesive-flow-out-prevention grooves 33 which prevent adhesive 17 from flowing out further (hereinafter referred to as "stopper grooves 33") are formed on the outside of the outermost receiver groove 31 and on the inside of the innermost receiver groove 31. Stopper groove 33 formed on the outside of the outermost receiver groove 31 prevents adhesive 17 from flowing out to the outside of resin case 16. Stopper groove 33 formed on the inside of the innermost receiver groove 31 prevents adhesive 17 from flowing out to the inside of resin case 16. Although stopper grooves 33 are formed on the outside and inside of receiver groove 31 according to the first embodiment of the invention, stopper groove 33 may be formed on the outside or inside of receiver groove 31.

Coating groove 30, receiver grooves 31, and stopper grooves 33 are formed continuously along all the peripheral sides of looped bonding plane 29 of resin case 16 facing metal base 10.

Metal base 10 is made of copper, aluminum, or a composite material of these metals. Resin case 16 is made of polyphenylene sulfide (PPS) or polybutylene terephthalate (PBT). A silicone resin adhesive or an epoxy resin adhesive is used for adhesive 17.

Coating groove 30, receiver groove 31, and stopper groove 33 are from 0.5 to 1 mm in depth from bonding plane 29 of resin case 16. Coating groove 30, receiver groove 31, and stopper groove 33 are formed such that the ratio of the groove width thereof and the spacing therebetween is 1 to 1. Especially, the coating groove 30 depth is selected with the adhesive 17 thickness, at which a high bonding strength is obtained, as a reference considering the relation between the thickness of adhesive 17 employed and the bonding strength. The distance between the wall on both sides of coating groove 30 and bonding plane 29, that is the escape space 32 thickness, is set to be from 0.2 to 0.25 mm.

Now an example of the process, through which resin case 16 is bonded to metal base 10, will be described below.

First, resin case 16 is turned over to make bonding plane 29 face upward and adhesive 17 is coated to coating groove 30 by a dispenser. The dispenser ejects adhesive 17 at the amount thereof controlled to be more or less excess to fill coating groove 30. The dispenser keeps ejecting a constant mount of adhesive 17 while moving along coating groove 30. As the dispenser finishes ejecting adhesive 17 along the entire coating groove 30, metal base 10 is mounted on bonding plane 29 of resin case 16, and metal base 10 is heated while metal base 10 is pressed to resin case 16 to harden adhesive 17 and to bond resin case 16 and metal base 10 to each other.

The excess amount of adhesive 17 which has flowed out from coating groove 30, when metal base 10 is pressed to resin case 16, is made to flow to escape space 32 adjoining to coating groove 30, received in escape space 32, and hardened therein.

When the coating amount of adhesive 17 to coating groove 30 is too large to be received in escape space 32, adhesive 17 which has flowed out from escape space 32 reaches receiver groove 31, communicating to escape space 32 and positioned outside escape space 32, and is received in receiver groove 31 securely. Therefore, adhesive 17 which has flowed out to receiver groove 31 never expands further. More in detail, adhesive 17 which has flowed out to receiver groove 31 never expands to the outside of resin case 16 (to the left-hand side of the drawing) nor to the inside of resin case 16, in which an insulator baseboard is housed.

If the dispenser ejects, due to the malfunction thereof, excess adhesive 17 too excess to be received in coating groove 30, escape space 32, and receiver groove 31, stopper groove 33 prevents adhesive 17 from flowing to the outside or the inside of resin case 16.

Figure 2:
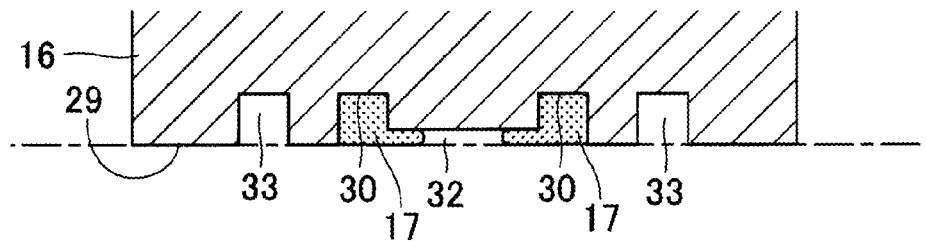
FIG. 2(A) is the expanded cross sectional view of a resin case showing a groove combination according to a second embodiment of the invention.
FIG. 2(B) is the expanded cross sectional view of a resin case showing a groove combination according to a third embodiment of the invention.
FIG. 2(C) is the expanded cross sectional view of a resin case showing a groove combination according to a fourth embodiment of the invention.
FIG. 2(D) is the expanded cross sectional view of a resin case showing a groove combination according to a fifth embodiment of the invention.
FIG. 2(E) is the expanded cross sectional view of a resin case showing a groove combination according to a sixth embodiment of the invention.
Figure 2:
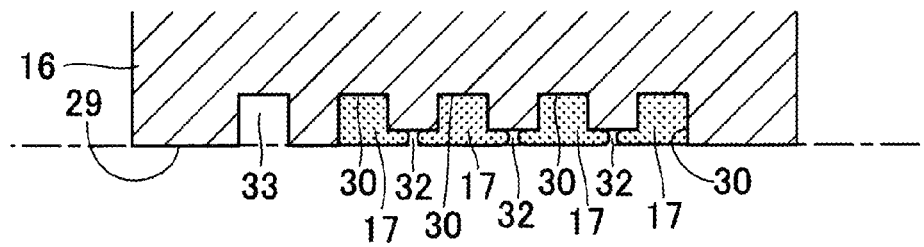
Figure 2:
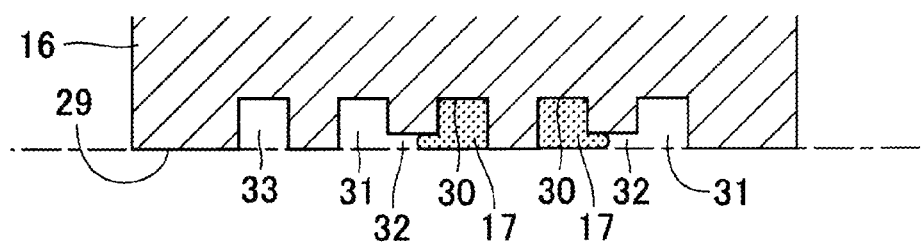
Figure 2:
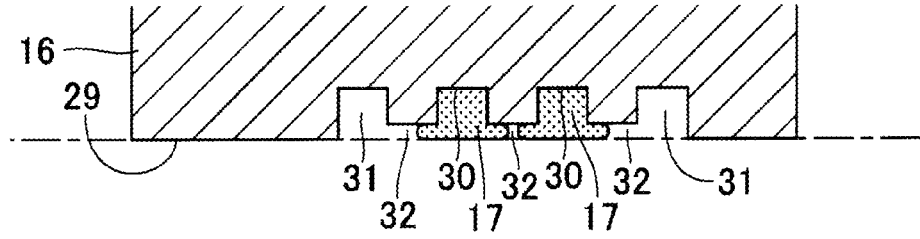
Figure 2:
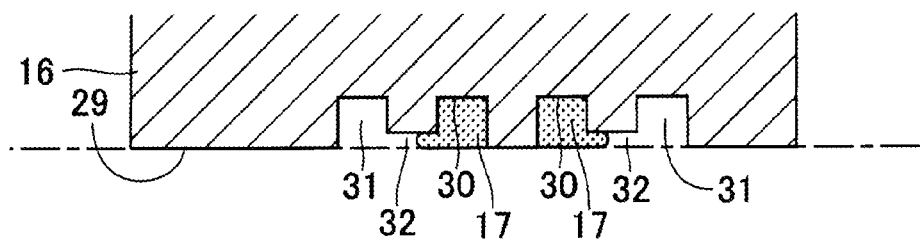

FIG. 2(A) is the expanded cross sectional view of a resin case showing a groove combination according to a second embodiment of the invention. FIG. 2(B) is the expanded cross sectional view of a resin case showing a groove combination according to a third embodiment of the invention. FIG. 2(C) is the expanded cross sectional view of a resin case showing a groove combination according to a fourth embodiment of the invention. FIG. 2(D) is the expanded cross sectional view of a resin case showing a groove combination according to a fifth embodiment of the invention. FIG. 2(E) is the expanded cross sectional view of a resin case showing a groove combination according to a sixth embodiment of the invention.

In the groove combination according to the second embodiment shown in FIG. 2(A), two coating grooves 30 are formed in bonding plane 29 of resin case 16 and escape space 32 is formed between coating grooves 30. By arranging two coating grooves 30 such that coating grooves 30 are spaced apart from each other more widely than the groove width thereof, the space of escape space 32 is expanded such that escape space 32 functions as receiver groove 31. On the outside and inside of coating grooves 30, stopper groove 33 is formed.

By increasing the number of coating grooves 30, the bonding strength between resin case 16 and metal base 10 is improved. Although escape space 32 is not so thick as to obtain a large bonding strength, further bonding strength improvement is expected, since the bonding area of escape space 32 is wide.

In the groove combination according to the third embodiment shown in FIG. 2(B), four coating grooves 30 are formed in bonding plane 29 of resin case 16 and escape space 32 is formed between coating grooves 30. On the outside of coating grooves 30, that is only in the edge area of resin case 16, stopper groove 33 is formed.

By increasing the number of coating grooves 30, the bonding strength between resin case 16 and metal base 10 is improved greatly. The groove combination according the third embodiment is applicable, for example, to the portion of resin case 16, into which external main terminal 19 is inserted. To the portion of resin case 16, into which external main terminal 19 is inserted, large vibration forces of ultrasonic vibrations caused by the ultrasonic welding of many bonding wires 26 are exerted. Although stopper groove 33 is formed on the peripheral side of resin case 16 according to the third embodiment, stopper groove 33 may be formed on the inside of the innermost coating groove 30, if necessary.

In the groove combination according to the fourth embodiment shown in FIG. 2(C), two couples of coating groove 30 and receiver groove 31 are formed in bonding plane 29 of resin case 16 and escape space 32 is formed between coating groove 30 and receiver groove 31. Stopper groove 33 is formed on the outside of the outside couple of coating groove 30 and receiver groove 31.

The groove combination according to the fourth embodiment facilitates obtaining the bonding strength between resin case 16 and metal base 10 the same with the bonding strength obtained by the groove combination according to the second embodiment. The groove combination according to the fourth embodiment facilitates obtaining the effects of preventing the adhesive from flowing out the same with the effects which the groove combination according to the third embodiment exhibits. Alternatively, three or more couples of coating groove 30 and receiver groove 31 may be formed, if necessary.

In the groove combination according to the fifth embodiment shown in FIG. 2(D), two couples of coating groove 30 and receiver groove 31 are formed in bonding plane 29 of resin case 16 and escape space 32 is formed between adjacent coating grooves 30. The groove combination according to the fifth embodiment facilitates expanding the space of escape space 32 more widely than the groove combination according to the fourth embodiment. The groove combination according to the fifth embodiment does not include any stopper groove 33 in bonding plane 29 of resin case 16.

The groove combination according to the sixth embodiment shown in FIG. 2(E) excludes stopper groove 33 from the groove combination according to the fourth embodiment shown in FIG. 2(C). In detail, only two couples of coating groove 30 and receiver groove 31 are formed in bonding plane 29 of resin case 16. Escape space 32 is formed between coating groove 30 and receiver groove 31. Therefore, the groove combination according to the sixth embodiment exhibits the bonding strength the same with the bonding strength which the groove combination according to the fourth embodiment exhibits.

Although the invention has been described so far in connection with the preferred embodiments thereof, changes and modifications are obvious to the persons skilled in the art without departing from the true spirit of the invention. Therefore, the invention be understood not by the specific descriptions herein but by the appended Claims thereof.

For example, coating groove 30 and receiver groove 31 are formed continuously along all the peripheral sides of bonding plane 29 of resin case 16. Alternatively, coating groove 30 and receiver groove 31 may be branched and jointed, respectively, to increase and decrease the numbers thereof locally.

This application is based on, and claims priority to, Japanese Patent Application No. 2010-150931, filed on Jul. 1, 2010. The disclosure of the priority application, in its entirety, including the drawings, claims, and the specification thereof, is incorporated herein by reference.

What is claimed is:

1. A semiconductor apparatus comprising;
    a metal base;
    a frame-shaped resin case bonded to the metal base for forming a space, in which a semiconductor chip is housed;
    an adhesive coating groove holding an adhesive at a predetermined position for bonding the resin case to the metal base, the adhesive coating groove being formed in a bonding plane of the resin case facing the metal base, the adhesive coating groove extending continuously along all peripheral sides of the bonding plane;

an adhesive escape space formed between a top plane of a side wall of the adhesive coating groove and the metal base, the top plane being spaced apart from a plane containing the bonding plane for introducing and receiving therein an excess amount of the adhesive coated to the adhesive coating groove; and a flowing-out-adhesive receiver groove formed in the bonding plane, the flowing-out-adhesive receiver groove being adjacent to the adhesive coating groove and communicating to the adhesive escape space.

2. The semiconductor apparatus according to claim 1, wherein the semiconductor apparatus comprises at least one additional adhesive coating groove and at least one additional adhesive escape space formed in the bonding plane.

3. The semiconductor apparatus according to claim 1, wherein the semiconductor apparatus comprises at least one additional adhesive coating groove, at least one additional flowing-out adhesive receiver groove and at least one additional adhesive escape space, formed in the bonding plane.

4. The semiconductor apparatus according to claim 3, the semiconductor apparatus further comprising:

an adhesive-flow-out-prevention groove formed on an outside of an outermost adhesive coating groove or an outermost flowing-out-adhesive receiver groove, the adhesive-flow-out-prevention groove preventing an adhesive, which has flowed out from the outermost adhesive coating groove or from the outermost flowing-out-adhesive receiver groove, from flowing out further.

5. The semiconductor apparatus according to claim 4, the semiconductor apparatus further comprising:

an adhesive-flow-out-prevention groove formed on an inside of an innermost adhesive coating groove or an innermost flowing-out-adhesive receiver groove, the adhesive-flow-out-prevention groove preventing an adhesive, which has flowed out from the innermost adhesive coating groove or from the innermost flowing-out-adhesive receiver groove, from flowing out further.

* * * * *